(12) United States Patent
Matsumoto et al.

(10) Patent No.: US 11,509,289 B2
(45) Date of Patent: Nov. 22, 2022

(54) COMPOSITE COMPONENT AND MOUNTING STRUCTURE THEREFOR

(71) Applicant: Murata Manufacturing Co., Ltd., Nagaokakyo (JP)

(72) Inventors: Katsuya Matsumoto, Nagaokakyo (JP); Yuji Toyota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 842 days.

(21) Appl. No.: 16/429,117

(22) Filed: Jun. 3, 2019

(65) Prior Publication Data

US 2019/0288669 A1    Sep. 19, 2019

Related U.S. Application Data

(63) Continuation of application No. PCT/JP2017/034528, filed on Sep. 25, 2017.

(30) Foreign Application Priority Data

Dec. 8, 2016  (JP) .............................. JP2016-238541

(51) Int. Cl.
*H03H 9/25*    (2006.01)
*H01L 23/00*    (2006.01)
(Continued)

(52) U.S. Cl.
CPC ............... *H03H 9/25* (2013.01); *H01L 24/05* (2013.01); *H01L 24/16* (2013.01); *H01L 25/00* (2013.01);
(Continued)

(58) Field of Classification Search
CPC ...... H03H 9/25; H03H 9/02015; H03H 9/059; H03H 9/1085; H03H 9/02574;
(Continued)

(56) References Cited

U.S. PATENT DOCUMENTS 5,111,100 A * 5/1992 Noguchi .................. H03H 3/08
        310/313 R
10,096,763 B2 * 10/2018 Iwamoto ................ H03H 9/059
(Continued)

FOREIGN PATENT DOCUMENTS

JP   2004-006564 A   1/2004
JP   2007-116628 A   5/2007
(Continued)

OTHER PUBLICATIONS

Official Communication issued in International Patent Application No. PCT/JP2017/034528, dated Dec. 12, 2017.

*Primary Examiner* — J. San Martin
(74) *Attorney, Agent, or Firm* — Keating & Bennett, LLP

(57) ABSTRACT

In a composite component, a semiconductor device is stacked on an elastic wave device. Side electrodes extend from at least one side surface of a piezoelectric substrate of the elastic wave device to at least a side surface of a semiconductor substrate of the semiconductor device and are connected to an IDT electrode and functional electrodes.

(Continued)

The side electrodes extend onto at least one of a second main surface of the piezoelectric substrate and a second main surface of the semiconductor substrate.

20 Claims, 4 Drawing Sheets

(51) Int. Cl.
    *H01L 25/00*     (2006.01)
    *H01L 41/08*     (2006.01)
    *H01L 41/083*     (2006.01)
    *H03H 9/02*     (2006.01)
    *H03H 9/05*     (2006.01)
    *H03H 9/10*     (2006.01)

(52) U.S. Cl.
    CPC ........ *H01L 41/083* (2013.01); *H01L 41/0805* (2013.01); *H03H 9/02015* (2013.01); *H03H 9/02574* (2013.01); *H03H 9/059* (2013.01); *H03H 9/1085* (2013.01); *H01L 2224/05* (2013.01); *H01L 2224/16225* (2013.01)

(58) Field of Classification Search
    CPC ... H01L 41/0805; H01L 41/083; H01L 24/16; H01L 24/05
    See application file for complete search history.

(56) References Cited

U.S. PATENT DOCUMENTS

| | | |
|---|---|---|
| 2009/0224851 A1 | 9/2009 | Feiertag et al. |
| 2009/0316378 A1 | 12/2009 | Haba et al. |
| 2010/0182101 A1 | 7/2010 | Suzuki |
| 2010/0230795 A1 | 9/2010 | Kriman et al. |
| 2011/0248410 A1* | 10/2011 | Avsian ................ H01L 25/0657 |
| | | 438/109 |
| 2016/0380616 A1 | 12/2016 | Takamine |
| 2017/0179920 A1* | 6/2017 | Kawasaki ............ H03H 9/1092 |
| 2018/0269849 A1* | 9/2018 | Matsumoto .......... H03H 9/1092 |
| 2019/0097599 A1* | 3/2019 | Taniguchi ............. H01L 23/481 |
| 2020/0127635 A1* | 4/2020 | Matsumoto ........ H03H 9/02897 |
| 2021/0036211 A1* | 2/2021 | Osawa ............... H03H 9/02826 |

FOREIGN PATENT DOCUMENTS

| | | | |
|---|---|---|---|
| JP | 2007-142105 A | 6/2007 | |
| JP | 2008-546207 A | 12/2008 | |
| JP | 2010-187373 A | 8/2010 | |
| JP | 2011-524647 A | 9/2011 | |
| JP | 2012-520567 A | 9/2012 | |
| JP | 2019114985 A * | 7/2019 | ............... H03H 9/05 |
| WO | 2009/157208 A1 | 12/2009 | |
| WO | 2014/054362 A1 | 4/2014 | |
| WO | 2015/151705 A1 | 10/2015 | |

* cited by examiner

COMPOSITE COMPONENT AND MOUNTING STRUCTURE THEREFOR

CROSS REFERENCE TO RELATED APPLICATIONS

This application claims the benefit of priority to Japanese Patent Application No. 2016-238541 filed on Dec. 8, 2016 and is a Continuation Application of PCT Application No. PCT/JP2017/034528 filed on Sep. 25, 2017. The entire contents of each of these applications are hereby incorporated herein by reference.

BACKGROUND OF THE INVENTION

1. Field of the Invention

The present invention relates to a composite component in which an elastic wave device and a semiconductor device are stacked and a mounting structure for the composite component.

2. Description of the Related Art

In order to reduce the size of electronic devices, various structures in each of which a plurality of electronic components are stacked have been proposed. For example, Japanese Unexamined Patent Application Publication No. 2010-187373 describes a composite component in which a piezoelectric-material substrate, which is made of lithium tantalite or the like, is stacked on a support substrate, which is made of silicon, via a bonding layer. A semiconductor device is able to be formed in the support substrate made of silicon, and a surface acoustic wave device is able to be formed by using the piezoelectric-material substrate.

A semiconductor device is an active element that generates heat when being driven. Also in an elastic wave device, such as a surface acoustic wave device, a portion in which an IDT electrode is disposed generates heat when the elastic wave device is driven.

Accordingly, when an elastic wave device and a semiconductor device are stacked as in the composite component described in Japanese Unexamined Patent Application Publication No. 2010-187373, in addition to heat generated by the elastic wave device itself, heat generated by the semiconductor device is applied to the elastic wave device. When the temperature of the elastic wave device becomes high, electrochemical migration between electrode fingers may occur in the IDT electrode. As a result, electrode breakage may occur due to the electrochemical migration, and characteristics may significantly deteriorate. Moreover, in addition to heat generated by the semiconductor device itself, heat generated by the elastic wave device is applied to the semiconductor device. Therefore, the characteristics of the semiconductor device may also deteriorate due to increase of temperature.

SUMMARY OF THE INVENTION

Preferred embodiments of the present invention provide composite components in each of which a semiconductor device and an elastic wave device are stacked, and also provide mounting structures for composite components each of which has a high heat dissipation ability.

A composite component according to a preferred embodiment of the present invention includes an elastic wave device including a piezoelectric substrate and an IDT electrode, the piezoelectric substrate including a first main surface and a second main surface that face each other and a plurality of side surfaces that connect the first main surface and the second main surface, the IDT electrode being disposed on at least one of the first main surface and the second main surface of the piezoelectric substrate; and a semiconductor device including a semiconductor substrate and a functional electrode, the semiconductor substrate including a first main surface and a second main surface that face each other and a plurality of side surfaces that connect the first main surface and the second main surface, the functional electrode being disposed on at least one of the first main surface and the second main surface of the semiconductor substrate. The elastic wave device and the semiconductor device are stacked such that the first main surface of the piezoelectric substrate and the first main surface of the semiconductor substrate face each other. The composite component further includes a side electrode that extends from at least one of the plurality of side surfaces of the piezoelectric substrate to at least one of the plurality of side surfaces of the semiconductor substrate, and that is connected to the IDT electrode and the functional electrode. The side electrode extends onto at least one of the second main surface of the piezoelectric substrate and the second main surface of the semiconductor substrate.

In a composite component according to a preferred embodiment of the present invention, the side electrode includes a plurality of side electrodes, and the side electrodes are connected to a common ground potential. In this case, a stability of an electrical signal is able to be increased.

In a composite component according to a preferred embodiment of the present invention, a metal layer is disposed between the first main surface of the piezoelectric substrate and the first main surface of the semiconductor substrate, and the metal layer is electrically connected to the side electrode. In this case, heat dissipation ability is able to be further increased.

In a composite component according to a preferred embodiment of the present invention, the metal layer is in contact with both of the first main surface of the piezoelectric substrate and the first main surface of the semiconductor substrate.

In a composite component according to a preferred embodiment of the present invention, the IDT electrode is disposed on the second main surface of the piezoelectric substrate, and the functional electrode is disposed on the second main surface of the semiconductor substrate. In this case, because heat generating portions are spaced away from each other, deterioration of characteristics due to increase of temperature is more unlikely to occur.

In a composite component according to a preferred embodiment of the present invention, a terminal electrode is disposed on at least one of the second main surface of the piezoelectric substrate and the second main surface of the semiconductor substrate, and the side electrode is electrically connected to the terminal electrode.

In a composite component according to a preferred embodiment of the present invention, a metal bump that is electrically connected to the terminal electrode is provided. In this case, the composite component is able to be mounted on the mounting substrate using the metal bump.

In a composite component according to a preferred embodiment of the present invention, the terminal electrode and the metal bump are disposed on the second main surface of the piezoelectric substrate. In this case, the composite component is able to be mounted on the mounting substrate from the elastic wave device side.

In a composite component according to a preferred embodiment of the present invention, the terminal electrode and the metal bump are disposed on the second main surface of the semiconductor substrate. In this case, the composite component is able to be mounted on the mounting substrate from the semiconductor device side.

In a composite component according to a preferred embodiment of the present invention, in addition to the elastic wave device and the semiconductor device, at least one of another elastic wave device and another semiconductor device is further stacked. In this case, the size of an electric device is able to be further reduced.

In a composite component according to a preferred embodiment of the present invention, the composite component further includes a heat insulation layer that is in contact with the first main surface of the piezoelectric substrate and the first main surface of the semiconductor substrate and that has lower heat conductivity than each of the semiconductor substrate and the piezoelectric substrate. In this case, the amount of heat conducted between the semiconductor device and the elastic wave device is able to be reduced. Thus, deterioration of the characteristics of the semiconductor device and the elastic wave device is able to be effectively reduced or prevented.

In a composite component according to a preferred embodiment of the present invention, the elastic wave device further includes a support layer that is disposed on one of the first main surface and the second main surface of the piezoelectric substrate on which the IDT electrode is disposed, the support layer surrounds the IDT electrode, and a cover that covers the support layer. In this case, a composite component including an elastic wave device having a wafer level packaging (WLP) structure is able to be provided.

In a composite component according to a preferred embodiment of the present invention, the piezoelectric substrate is a piezoelectric-material substrate.

In a composite component according to a preferred embodiment of the present invention, the piezoelectric substrate includes a support substrate and a piezoelectric layer that is disposed on the support substrate.

In a composite component according to a preferred embodiment of the present invention, the elastic wave device includes a high-acoustic-velocity-material layer that is directly or indirectly stacked on the piezoelectric layer and in which a bulk wave propagates at an acoustic velocity that is higher than an acoustic velocity of an elastic wave that propagates in the piezoelectric layer.

In a composite component according to a preferred embodiment of the present invention, the support substrate is a high-acoustic-velocity substrate including the high-acoustic-velocity-material layer.

In a composite component according to a preferred embodiment of the present invention, the support substrate includes a low-acoustic-velocity-material layer that is stacked on the high-acoustic-velocity-material layer and in which a bulk wave propagates at an acoustic velocity that is lower than the acoustic velocity of an elastic wave that propagates in the piezoelectric layer.

A mounting structure for a composite component according to a preferred embodiment of the present invention includes a composite component according to a preferred embodiment of the present invention, and a mounting substrate. The composite component is mounted on the mounting substrate from one of a side of the second main surface of the piezoelectric substrate and a side of the second main surface of the semiconductor substrate of the semiconductor device.

With preferred embodiments of the present invention, the heat dissipation ability of a composite component in which an elastic wave device and a semiconductor device are stacked and the heat dissipation ability of a mounting structure for the composite component are able to be effectively increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail with reference to the accompanying drawings.

Each of the preferred embodiments described in the present description is exemplary, and some elements of different preferred embodiments may be replaced with each other or used in combination with each other.

Figure 1:
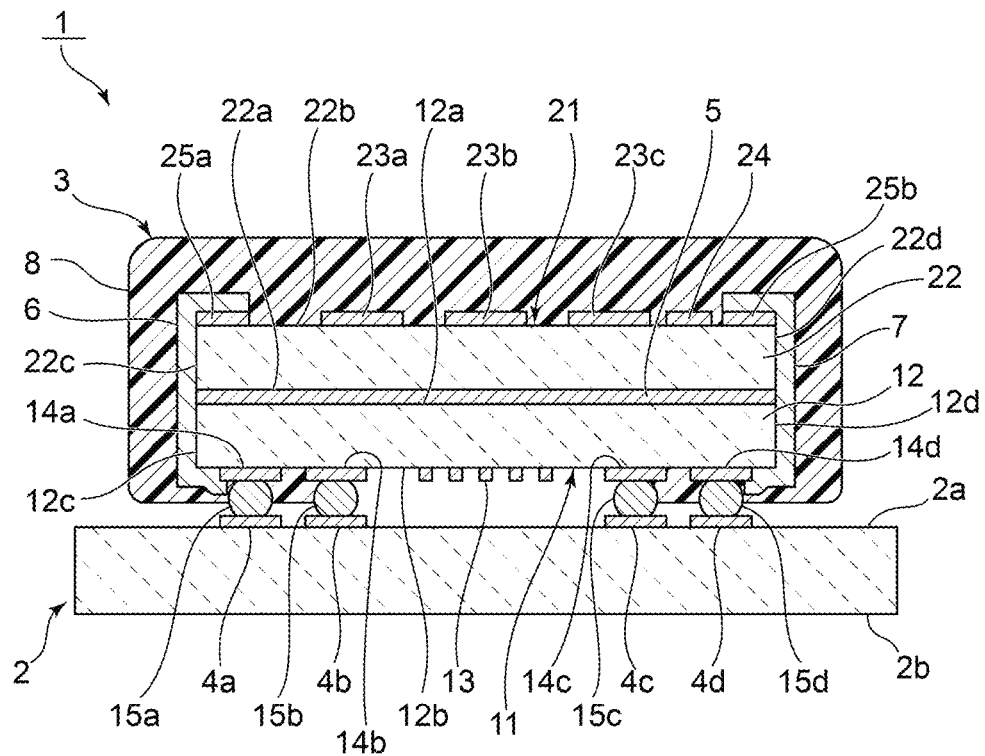
FIG. 1 is a front sectional view of a mounting structure for a composite component according to a first preferred embodiment of the present invention.

FIG. 1 is a front sectional view of a mounting structure for a composite component 3 according to a first preferred embodiment of the present invention.

The mounting structure 1 includes a mounting substrate 2 and the composite component 3 mounted on the mounting substrate 2. The mounting substrate 2 includes first and second main surfaces 2a and 2b that face each other. Electrode lands 4a to 4d are disposed on the first main surface 2a.

The mounting substrate 2 is preferably made of insulating ceramics, such as alumina, for example. However, the material of the mounting substrate 2 is not limited, and may be a semiconductor material or an organic material, such as a synthetic resin, for example. The electrode lands 4a to 4d are preferably made of, for example, a metal, such as Cu. The composite component 3 is joined to the electrode lands 4a to 4d.

The composite component 3 includes an elastic wave device 11 and a semiconductor device 21. The semiconductor device 21 is stacked on the elastic wave device 11 via a metal layer 5, which is a heat conductive layer.

The elastic wave device 11 includes a piezoelectric substrate 12. In the present preferred embodiment, the piezoelectric substrate 12 is preferably made of a piezoelectric single crystal, for example. That is, the piezoelectric substrate 12 is a piezoelectric-material substrate the entirety of which is made of a piezoelectric layer. LaTiO$_3$, LiNbO$_3$, or other suitable materials, for example, may be used as the piezoelectric single crystal. However, the piezoelectric substrate 12 may be made of piezoelectric ceramics.

The piezoelectric substrate 12 includes first and second main surfaces 12a and 12b that face each other. The second main surface 12b faces the first main surface 2a of the mounting substrate 2 with a gap therebetween. An IDT electrode 13 is disposed on the second main surface 12b. Terminal electrodes 14a to 14d are disposed on the second main surface 12b. The IDT electrode 13 and the terminal electrodes 14a to 14d are each preferably made of, for example, an appropriate metal such as Al, Cu, or Pt, or an appropriate alloy such as an Al—Cu alloy. The IDT electrode 13 and the terminal electrodes 14a to 14d may each be made from a laminated metal film including a plurality of metal films.

At least one of the terminal electrodes 14a to 14d is electrically connected to the IDT electrode 13.

Metal bumps 15a to 15d, each of which is preferably made of solder, Au, or other suitable material, for example, are disposed on the terminal electrodes 14a to 14d. The metal bumps 15a to 15d are joined to the electrode lands 4a to 4d.

In the elastic wave device 11, a surface acoustic wave element including the IDT electrode 13 is provided. The surface acoustic wave element may preferably be a surface acoustic wave resonator or a surface acoustic wave filter, for example. Accordingly, in the elastic wave device 11, the structure of a functional electrode portion including the IDT electrode 13 is not particularly limited.

The metal layer 5 is preferably made of, for example, an appropriate metal, such as Al or Cu, or an appropriate alloy. The metal layer 5, which is made of a metal, has higher heat conductivity than the piezoelectric substrate 12.

The semiconductor device 21 includes a semiconductor substrate 22. The semiconductor substrate 22 is made of an appropriate semiconductor material, such as Si, for example. Preferably, the semiconductor substrate 22 is made of Si, for example, which has high heat conductivity.

The semiconductor substrate 22 includes first and second main surfaces 22a and 22b that face each other. The first main surface 22a is joined to the metal layer 5. That is, the metal layer 5 is in contact with the entirety or substantially the entirety of both of the first main surface 22a of the semiconductor substrate 22 and the first main surface 12a of the piezoelectric substrate 12 and joins the first main surface 22a and the first main surface 12a to each other. However, the metal layer 5 need not be in contact with the entirety or substantially the entirety of the first main surfaces 12a and 22a.

Functional electrodes including a source electrode 23a, a gate electrode 23b, and a drain electrode 23c are provided on the second main surface 22b of the semiconductor substrate 22. In the present preferred embodiment, an FET including the source electrode 23a, the gate electrode 23b, and the drain electrode 23c is preferably provided. However, the structure of the functional electrodes of the semiconductor device 21 is not limited to this, and may be provided so as to include various circuits including a semiconductor element in the semiconductor device 21. An electrode 24 of a capacitor is also disposed on the second main surface 22b. As in this case, not only a semiconductor element but also an electrode of an electronic component element, such as a capacitor, for example, may be disposed on the second main surface 22b.

Terminal electrodes 25a and 25b are disposed on the second main surface 22b. The terminal electrodes 25a and 25b may be electrically connected to the FET or the capacitor.

The terminal electrodes 25a and 25b are provided to electrically connect the semiconductor device 21 to the outside or to the elastic wave device 11.

The source electrode 23a, the gate electrode 23b, the drain electrode 23c, the electrode 24, and the terminal electrodes 25a and 25b are each preferably made of an appropriate metal, such as Al or Cu or an appropriate alloy such as an Al—Cu alloy, for example.

In the composite component 3, the piezoelectric substrate 12 and the semiconductor substrate 22 are joined to each other via the metal layer 5. Thus, the elastic wave device 11 and the semiconductor device 21 are stacked and integrated. Side electrodes 6 and 7 are disposed on side surfaces of the integrated structure.

That is, the side electrode 6 extends from a side surface 12c of the piezoelectric substrate 12, via a side surface of the metal layer 5, to a side surface 22c of the semiconductor substrate 22. The side electrode 6 extends onto the second main surface 12b of the piezoelectric substrate 12 and is joined to the terminal electrode 14a. Moreover, the side electrode 6 extends onto the second main surface 22b of the semiconductor substrate 22 and is joined to the terminal electrode 25a. Accordingly, the terminal electrode 25a and the terminal electrode 14a are electrically connected to each other via the side electrode 6. The side electrode 6 is also joined to the metal layer 5. The side electrode 6 is connected to the ground potential.

The side electrode 7 is also connected to the ground potential. The side electrode 7 extends from a side surface 12d of the piezoelectric substrate 12, via a side surface of the metal layer 5, to a side surface 22d of the semiconductor substrate 22. The side electrode 7 extends onto the second main surface 12b of the piezoelectric substrate 12 and is joined to the terminal electrode 14d. The side electrode 7 extends onto the second main surface 22b of the semiconductor substrate 22 and is joined to the terminal electrode 25b. The side electrode 7 is also joined to the metal layer 5. The terminal electrode 25b and the terminal electrode 14d are also connected to the ground potential. Accordingly, both of the side electrode 6 and the side electrode 7 are connected to the ground potential. Thus, in the composite component 3, due to connection to the ground potential, grounding is strengthened, and electrical stability is able to be increased.

The side electrodes 6 and 7 are each preferably made of an appropriate metal or an appropriate alloy. Examples of such a metal, which is not particularly limited, include Al, Cu, and an Al—Cu alloy.

In the composite component 3, a resin layer 8 covers the elastic wave device 11 and the semiconductor device 21. The resin layer 8 is not disposed on a functional electrode portion, which includes the IDT electrode 13, of the elastic wave device 11. Accordingly, the resin layer 8 is not disposed on a portion that is inside of the metal bumps 15b and 15c in a direction parallel or substantially parallel to the second main surface 12b.

A thermosetting resin, such as an epoxy resin, for example, may preferably be used as the material of the resin layer 8. However, the material of the resin layer 8 is not particularly limited.

When the composite component 3 is driven, the elastic wave device 11 and the semiconductor device 21 generate heat. However, due to the presence of the side electrodes 6 and 7, heat generated by the semiconductor device 21 is rapidly conducted to the mounting substrate 2 via the terminal electrodes 14a and 14d, the metal bumps 15a and 15d, and the electrode lands 4a and 4d. similarly, heat generated by the elastic wave device 11 is also released to the mounting substrate 2 via the terminal electrodes 14a to 14d, the metal bumps 15a to 15d, and the electrode lands 4a to 4d.

Accordingly, heat dissipation ability is effectively increased. Thus, deterioration of the characteristics of the elastic wave device 11 and the semiconductor device 21 is not likely to occur. In particular, in a general elastic wave device, when the temperature of an IDT electrode increases, electrochemical migration occurs between electrode fingers, and electrode breakage may occur. However, with the composite component 3 according to the present preferred embodiment, not only heat generated by the elastic wave device 11, but also heat generated by the semiconductor device 21 are rapidly released to the mounting substrate 2. Accordingly, electrochemical migration between electrode fingers is not likely to occur.

In addition, in the composite component 3, due to the presence of the metal layer 5, heat conducted to the first main surface 12a of the piezoelectric substrate 12 in the elastic wave device 11 and heat conducted to the first main surface 22a of the semiconductor substrate 22 in the semiconductor device 21 are also rapidly released via the side electrodes 6 and 7. Therefore, heat dissipation ability is further increased.

However, the metal layer 5 may be omitted.

Figure 2:
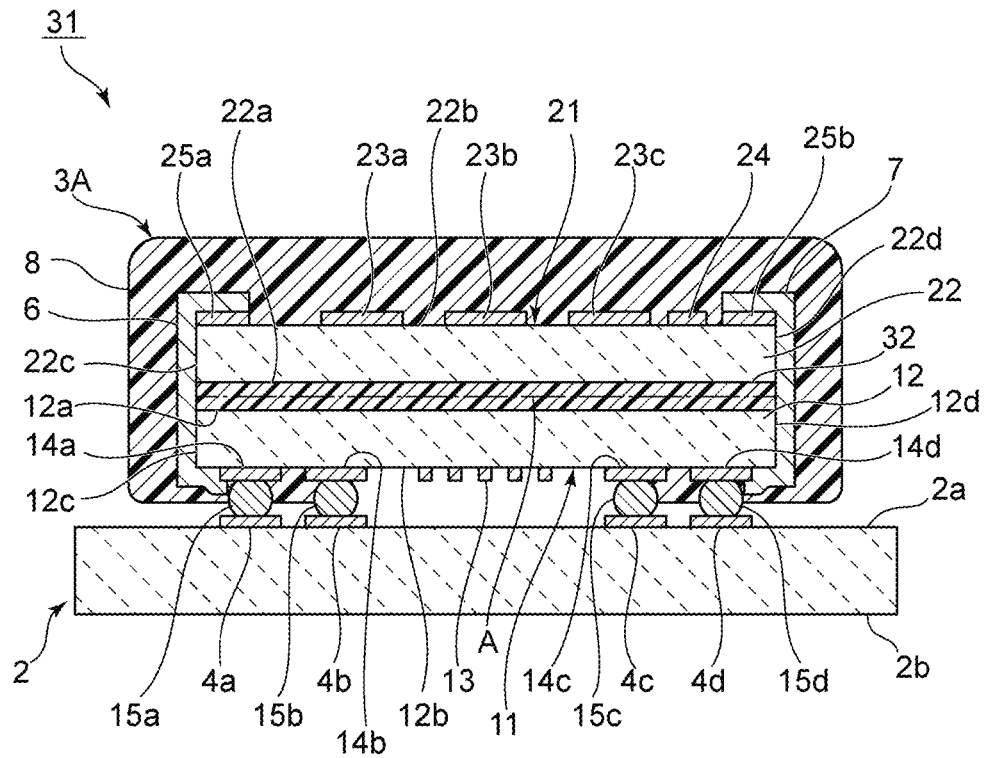
FIG. 2 is a front sectional view of a mounting structure for a composite component according to a second preferred embodiment of the present invention.

FIG. 2 is a front sectional view of a mounting structure 31 for a composite component 3A according to a second preferred embodiment of the present invention.

In the mounting structure 31 illustrated FIG. 2, the elastic wave device 11 and the semiconductor device 21 are joined to each other via a heat insulation layer 32. The heat conductivity of the heat insulation layer 32 is lower than the heat conductivity of each of the semiconductor substrate 22 and the piezoelectric substrate 12. A synthetic resin or other suitable material, for example, may preferably be used as the heat insulation layer 32. Except that the heat insulation layer 32 is provided, instead of the metal layer 5 illustrated in FIG. 1, the composite component 3A is the same or substantially the same as the composite component 3 illustrated in FIG. 1. Accordingly, portions of the mounting structure 31 that are the same as those of the mounting structure 1 illustrated in FIG. 1 will be denoted by the same reference numerals, and reference should be made to the description of the mounting structure 1.

In the present preferred embodiment, although the heat insulation layer 32 is provided, instead of the metal layer 5, heat generated by the semiconductor device 21 is rapidly released to the mounting substrate 2 via the side electrodes 6 and 7. Similarly, heat generated by the elastic wave device 11 is also rapidly released to the mounting substrate 2. Accordingly, due to the high heat dissipation ability, an increase in temperature in the elastic wave device 11 and the semiconductor device 21 is able to be effectively reduced or prevented.

In addition to the heat insulation layer 32, the metal layer 5 illustrated in FIG. 1 may be further stacked. For example, a metal layer may be disposed so as to have a thickness from the first main surface 12a of the piezoelectric substrate 12 to a position shown by a chain line A in FIG. 2. On the metal layer, a heat insulation layer may be disposed so as to have a thickness from the chain line A to the first main surface 22a of the semiconductor substrate 22. In this case, as in the first preferred embodiment, even if heat generated by the IDT electrode 13 reaches the first main surface 12a in the elastic wave device 11, the heat is able to be rapidly released to the side electrodes 6 and 7.

Figure 3:
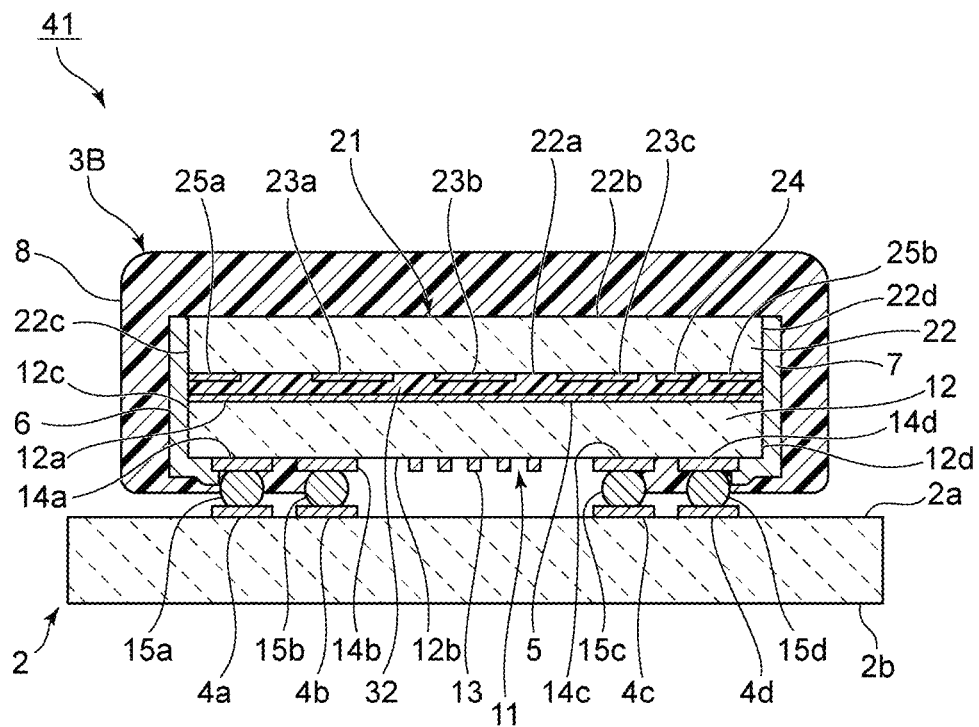
FIG. 3 is a front sectional view of a mounting structure for a composite component according to a third preferred embodiment of the present invention.

FIG. 3 is a front sectional view of a mounting structure 41 for a composite component 3B according to a third preferred embodiment of the present invention. In the mounting structure 41 according to the third preferred embodiment, the source electrode 23a, the gate electrode 23b, and the drain electrode 23c, which are functional electrodes, and the electrode 24 are disposed on the first main surface 22a of the semiconductor device 21. The terminal electrodes 25a and 25b are also disposed on the first main surface 22a. As in the present preferred embodiment, in the semiconductor device 21, the source electrode 23a and other electrodes, which are functional electrodes of a semiconductor element, may be disposed on the first main surface 22a, which faces the elastic wave device 11. In this case, in order to increase heat dissipation ability, the metal layer 5 is disposed on the first main surface 12a of the piezoelectric substrate 12. The heat insulation layer 32 is disposed so as to fill a space between the metal layer 5 and the first main surface 22a of the semiconductor substrate 22.

In a preferred embodiment of the present invention, functional electrodes may preferably be disposed on both of the first main surface 22a and the second main surface 22b of the semiconductor substrate 22.

The side electrodes 6 and 7 are connected to the terminal electrodes 25a and 25b. The side electrodes 6 and 7 do not extend onto the second main surface 22b.

In other respects, the mounting structure 41 is the same or substantially the same as the mounting structure 1. Also in the present preferred embodiment, heat generated by the semiconductor device 21 is rapidly released to the mounting substrate 2 via the side electrodes 6 and 7. Heat generated by the elastic wave device 11 is also rapidly released to the mounting substrate 2 in the same manner as in the mounting structure 1. In addition, due to the presence of the metal layer 5, heat that is generated by the elastic wave device 11 and conducted to the first main surface 12a of the piezoelectric substrate 12 is also able to be rapidly released via the side electrodes 6 and 7. Accordingly, in the same manner as in the first and second preferred embodiments, also with the composite component 3B according to the third preferred embodiment, heat dissipation ability is able to be effectively increased.

Figure 4:
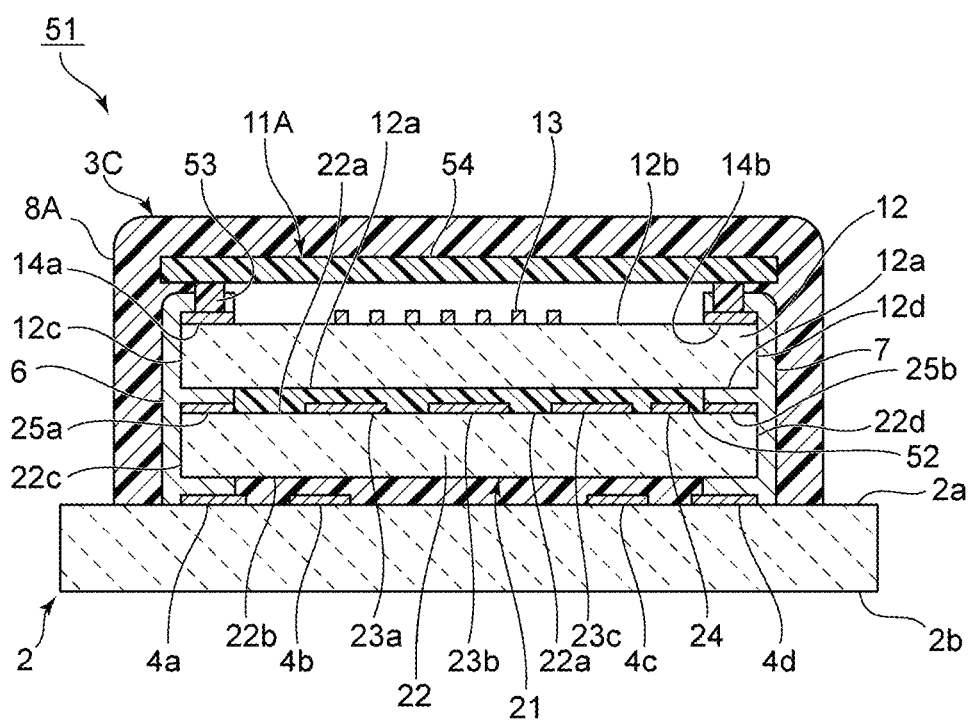
FIG. 4 is a front sectional view of a mounting structure for a composite component according to a fourth preferred embodiment of the present invention.

FIG. 4 is a front sectional view of a mounting structure 51 for a composite component 3C according to a fourth preferred embodiment of the present invention.

In the mounting structure 51, an elastic wave device 11A is stacked on the semiconductor device 21. The first main surface 22a of the semiconductor substrate 22 faces the first main surface 12a of the piezoelectric substrate 12 of the elastic wave device 11A. A resin layer 52 is disposed between the first main surface 22a and the first main surface 12a. Thus, the semiconductor device 21 and the elastic wave device 11A are joined to each other. The elastic wave device 11A has a WLP structure. That is, the elastic wave device 11A includes a support layer 53 that is disposed on the second main surface 12b of the piezoelectric substrate 12. A cover 54 covers the support layer 53. The support layer 53 and the cover 54 are each preferably made of, for example, a synthetic resin. However, a different insulating material, such as insulating ceramics, may be used.

The IDT electrode 13 is surrounded by the support layer 53. Thus, a hollow portion that the IDT electrode 13 faces is provided.

An elastic wave device having a WLP structure, such as the elastic wave device 11A, may be used. Also in the present preferred embodiment, the side electrodes 6 and 7 extend from the side surfaces 12c and 12d of the piezoelectric substrate 12 to the side surfaces 22c and 22d of the semiconductor substrate 22 of the semiconductor device 21. Moreover, the side electrodes 6 and 7 are joined to the terminal electrodes 14a and 14b, the terminal electrodes 25a and 25b, and the electrode lands 4a and 4d. That is, the side electrodes 6 and 7 extend onto the second main surface 12b of the piezoelectric substrate 12 and are joined to the terminal electrodes 14a and 14b. The side electrodes 6 and 7 also extend onto the first main surface 22a of the semiconductor substrate 22 and are joined to the terminal electrodes 25a and 25b. Moreover, the side electrodes 6 and 7 also extend onto the second main surface 22b and are joined to the electrode lands 4a and 4d.

In the mounting structure 51, a resin layer 8A also extends to a space between the second main surface 22b and the first main surface 2a of the mounting substrate 2. Accordingly, the mechanical strength of the mounting structure 51 is increased. Due to the presence of the side electrodes 6 and 7, heat generated by the elastic wave device 11A and heat generated by the semiconductor device 21 are rapidly released to the mounting substrate 2. Accordingly, in the same manner as in the first to third preferred embodiments, deterioration of characteristics of the elastic wave device 11A and the semiconductor device 21 due to an increase in temperature is not likely to occur.

Figure 5:
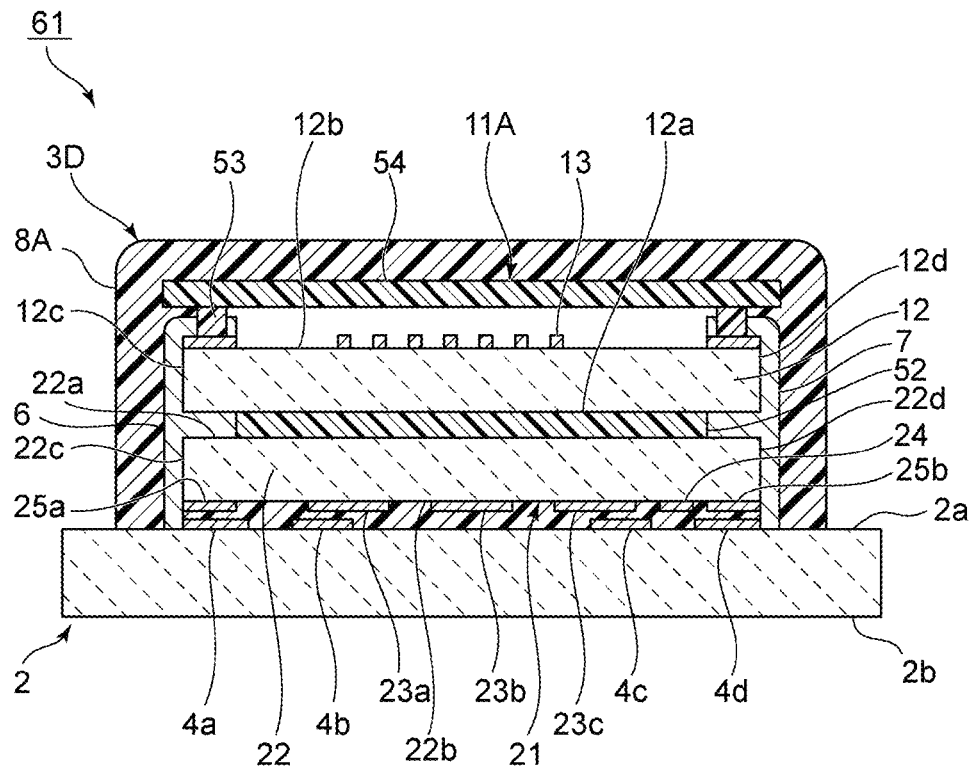
FIG. 5 is a front sectional view of a mounting structure for a composite component according to a fifth preferred embodiment of the present invention.

FIG. 5 is a front sectional view of a mounting structure 61 for a composite component 3D according to a fifth preferred embodiment of the present invention.

In the mounting structure 61, the source electrode 23a, the gate electrode 23b, and the drain electrode 23c, which are functional electrodes, and the electrode 24 are disposed on the second main surface 22b of the semiconductor substrate 22 of the semiconductor device 21. The terminal electrodes 25a and 25b are also disposed on the second main surface 22b. Metal bumps may be disposed on the terminal electrodes 25a and 25b, and the metal bumps may be joined to the electrode lands 4a and 4b of the mounting substrate 2. In other respects, the mounting structure 61 is the same or substantially the same as the mounting structure 51.

In the mounting structure 61, an increase in temperature in the composite component 3D is able to be more effectively reduced or prevented. That is, due to the presence of the side electrodes 6 and 7, heat generated by the elastic wave device 11A and the semiconductor device 21 is rapidly released to the mounting substrate 2. In addition, in the elastic wave device 11A, the IDT electrode 13 is disposed on the second main surface 12b of the piezoelectric substrate 12. In the semiconductor device 21, the source electrode 23a, the gate electrode 23b, and the drain electrode 23c are disposed on the second main surface 22b of the semiconductor substrate 22. Accordingly, heat generating portions of the elastic wave device 11A and the semiconductor device 21 are spaced away from each other. Thus, the elastic wave device 11A or the semiconductor device 21 is more unlikely to be affected by heat generated by the other of the devices.

In other respects, the mounting structure 61 is the same or substantially the same as the mounting structure 51. Accordingly, the same or similar portions are denoted by the same reference numerals and descriptions thereof are omitted.

Figure 6:
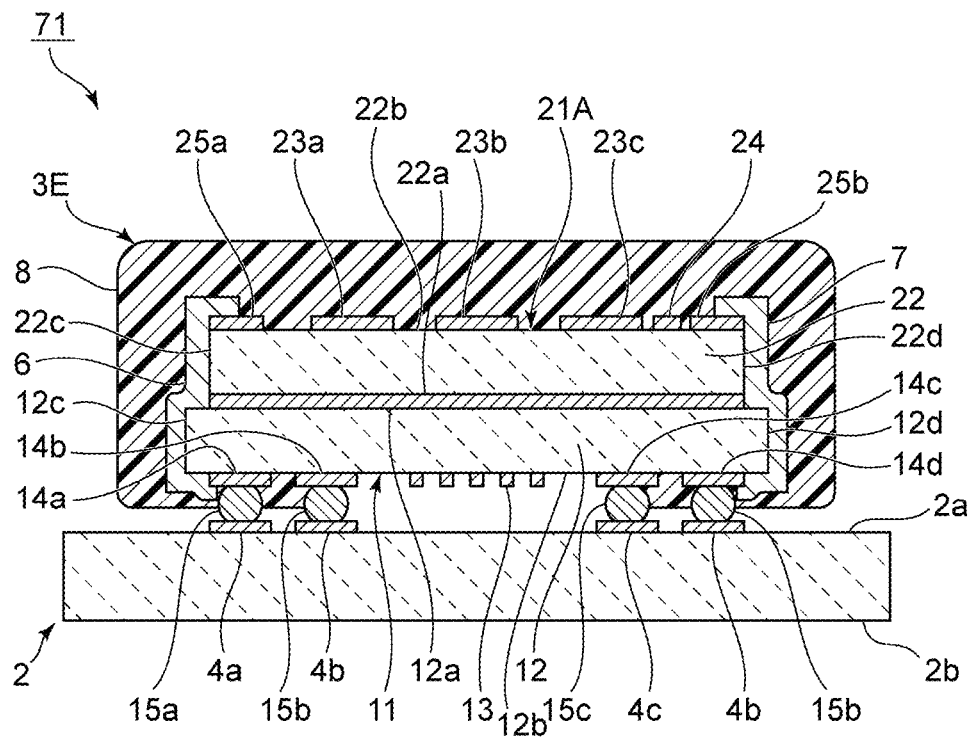
FIG. 6 is a front sectional view of a mounting structure for a composite component according to a sixth preferred embodiment of the present invention.

FIG. 6 is a front sectional view of a mounting structure 71 for a composite component 3E according to a sixth preferred embodiment of the present invention. In the mounting structure 71, the outer shape of the semiconductor substrate 22 of a semiconductor device 21A is smaller than that of the piezoelectric substrate 12. That is, the dimension of the semiconductor substrate 22 in a direction connecting the side surface 22c and the side surface 22d is smaller than the dimension of the piezoelectric substrate 12 in a direction connecting the side surface 12c and the side surface 12d. As in the present preferred embodiment, the semiconductor substrate 22 and the piezoelectric substrate 12 that have different dimensions may be stacked. In FIG. 6, the semiconductor substrate 22 is smaller than the piezoelectric substrate 12. Conversely, the piezoelectric substrate 12 may be smaller than the semiconductor substrate 22.

Because the semiconductor substrate 22 is small as described above, the side electrodes 6 and 7 extend from positions on the first main surface 12a of the piezoelectric substrate 12 onto the side surfaces 22c and 22d of the semiconductor substrate 22. Thus, in the sectional view shown in FIG. 6, the side electrodes 6 and 7 each have a stepped shape.

As in the mounting structure 71, in a preferred embodiment of the present invention, the size of the semiconductor substrate 22 may differ from that of the piezoelectric substrate 12. In other respects, the mounting structure 71 is the same or substantially the same as the mounting structure 1. Accordingly, the same or similar portions are denoted by the same reference numerals, and reference should be made to the description of the mounting structure 1.

Figure 7:
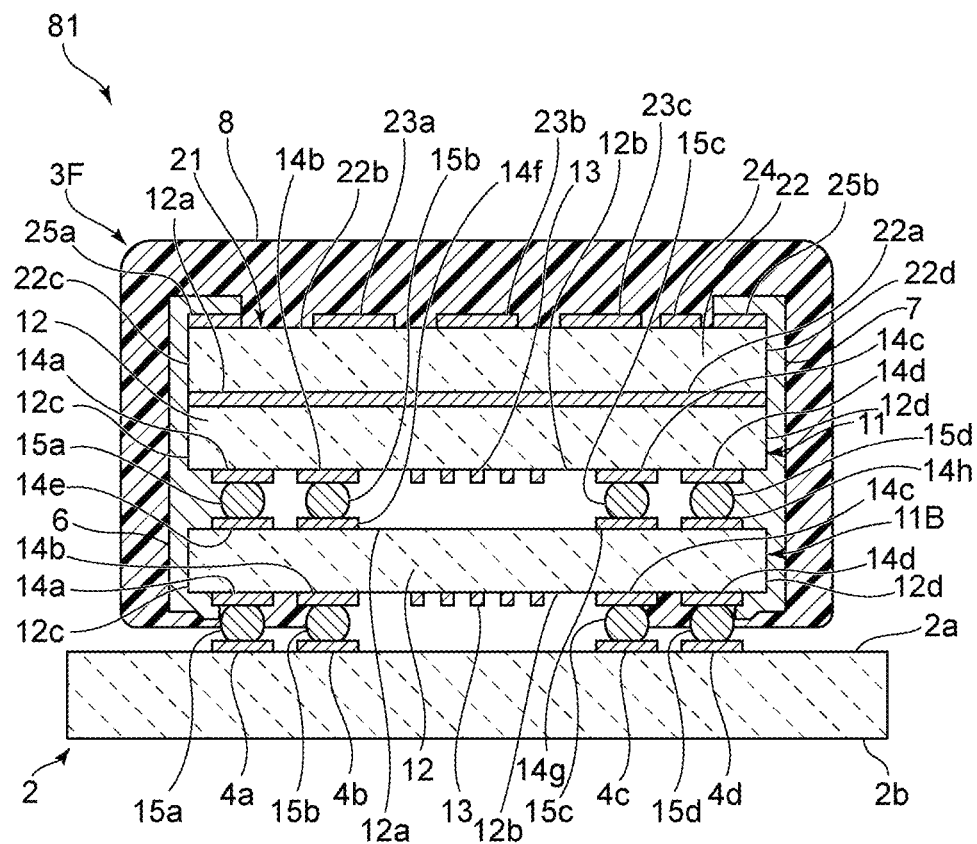
FIG. 7 is a front sectional view of a mounting structure for a composite component according to a seventh preferred embodiment of the present invention.

FIG. 7 is a front sectional view of a mounting structure 81 for a composite component 3F according to a seventh preferred embodiment of the present invention. In the composite component 3F, the elastic wave device 11 and the semiconductor device 21 are stacked on an elastic wave device 11B. That is, another elastic wave device 11B is further stacked below the elastic wave device 11 of the composite component 3 according to the first preferred embodiment. As in the present preferred embodiment, on a stack of an elastic wave device and a semiconductor device, at least one of another elastic wave device or another semiconductor device may be further stacked.

In the mounting structure 81, the elastic wave device 11B has the same or substantially the same structure as the elastic wave device 11. Accordingly, the same or similar portions will be denoted by the same reference numerals and descriptions thereof will be omitted.

The terminal electrodes 14a to 14d of the elastic wave device 11B are joined to the electrode lands 4a to 4d on the first main surface 2a of the mounting substrate 2 via the metal bumps 15a to 15d. In the elastic wave device 11B, terminal electrodes 14e to 14h are disposed on the first main surface 12a of the piezoelectric substrate 12. The terminal electrodes 14e to 14h are joined to the metal bumps 15a to 15d of the elastic wave device 11.

In the elastic wave device 11, the side electrodes 6 and 7 extend from the side surfaces 12c and 12d of the piezoelectric substrate 12 of the elastic wave device 11 to the side surfaces 22c and 22d of the semiconductor substrate 22 of the semiconductor device 21 and extend further to the side surfaces 12c and 12d of the piezoelectric substrate 12 of the elastic wave device 11B, which are located below the side surfaces 12c and 12d. The side electrodes 6 and 7 are joined to the terminal electrodes 25a and 25b of the semiconductor device 21 on the second main surface 22b. The side electrodes 6 and 7 are also joined to the terminal electrodes 14a and 14d, the terminal electrode 14e and 14h, and the metal bumps 15a and 15d that connect these. The side electrodes 6 and 7 are also joined to the terminal electrodes 14a and 14d and the metal bumps 15a and 15d. The terminal electrodes 14a and 14d are disposed on the second main surface 12b of the piezoelectric substrate 12 of the elastic wave device 11B.

Accordingly, with the mounting structure 81, heat generated by the semiconductor device 21 and heat generated by the elastic wave devices 11 and 11B are rapidly released to the mounting substrate 2 via the side electrodes 6 and 7.

Figure 8:
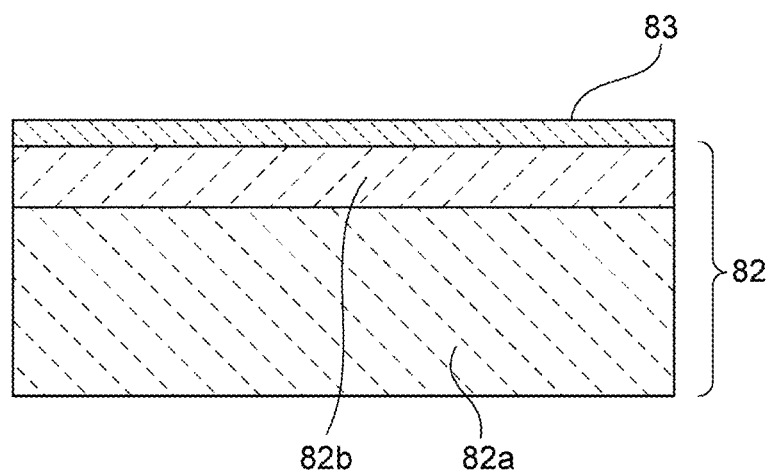
FIG. 8 is a front sectional view of a piezoelectric substrate used in an eighth preferred embodiment of the present invention.

FIG. 8 is a front sectional view of a piezoelectric substrate used in a composite component according to an eighth preferred embodiment of the present invention. In the first to seventh preferred embodiments, the piezoelectric substrate 12 is preferably made of one piezoelectric layer, that is, a piezoelectric single crystal, for example. As illustrated in FIG. 8, a piezoelectric substrate in which a piezoelectric layer 83 is stacked on a support substrate 82 may preferably be used. In this case, an IDT electrode is disposed on the piezoelectric layer 83.

In the piezoelectric substrate, the support substrate 82 includes a high-acoustic-velocity-material layer 82a and a low-acoustic-velocity-material layer 82b. The high-acoustic-velocity-material layer 82a is preferably made of, for example, Si or other suitable material. The acoustic velocity of a bulk wave that propagates in the high-acoustic-velocity-material layer 82a is higher than the acoustic velocity of an elastic wave that propagates in the piezoelectric layer 83. On the other hand, the acoustic velocity of a bulk wave that propagates in the low-acoustic-velocity-material layer 82b is lower than the acoustic velocity of an elastic wave that propagates in the piezoelectric layer 83. The low-acoustic-velocity-material layer 82b may preferably be made of, for example, insulating ceramics, such as $SiO_2$, a synthetic resin, or other suitable material.

The low-acoustic-velocity-material layer 82b may be omitted. That is, the piezoelectric layer 83 may be directly stacked on a support substrate that is a high-acoustic-velocity substrate including the high-acoustic-velocity-material layer 82a.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite component comprising:
   an elastic wave device including a piezoelectric substrate and an IDT electrode, the piezoelectric substrate including a first main surface and a second main surface that face each other and a plurality of side surfaces that connect the first main surface and the second main surface, the IDT electrode being disposed on at least one of the first main surface and the second main surface of the piezoelectric substrate; and
   a semiconductor device including a semiconductor substrate and a functional electrode, the semiconductor substrate including a first main surface and a second main surface that face each other and a plurality of side surfaces that connect the first main surface and the second main surface, the functional electrode being disposed on at least one of the first main surface and the second main surface of the semiconductor substrate; wherein
   the elastic wave device and the semiconductor device are stacked such that the first main surface of the piezoelectric substrate and the first main surface of the semiconductor substrate face each other;
   the composite component further includes a side electrode that extends from at least one of the plurality of side surfaces of the piezoelectric substrate to at least one of the plurality of side surfaces of the semiconductor substrate and that is connected to the IDT electrode and the functional electrode; and
   the side electrode extends onto at least one of the second main surface of the piezoelectric substrate and the second main surface of the semiconductor substrate.

2. The composite component according to claim 1, wherein
   the side electrode includes a plurality of side electrodes; and
   the side electrodes are connected to a common ground potential.

3. The composite component according to claim 1, wherein
   a metal layer is disposed between the first main surface of the piezoelectric substrate and the first main surface of the semiconductor substrate; and
   the metal layer is electrically connected to the side electrode.

4. The composite component according to claim 3, wherein the metal layer is in contact with both of the first main surface of the piezoelectric substrate and the first main surface of the semiconductor substrate.

5. The composite component according to claim 1, wherein
   the IDT electrode is disposed on the second main surface of the piezoelectric substrate; and
   the functional electrode is disposed on the second main surface of the semiconductor substrate.

6. The composite component according to claim 1, wherein
   a terminal electrode is disposed on at least one of the second main surface of the piezoelectric substrate and the second main surface of the semiconductor substrate; and
   the side electrode is electrically connected to the terminal electrode.

7. The composite component according to claim 6, wherein a metal bump is electrically connected to the terminal electrode.

8. The composite component according to claim 7, wherein the terminal electrode and the metal bump are disposed on the second main surface of the piezoelectric substrate.

9. The composite component according to claim 7, wherein the terminal electrode and the metal bump are disposed on the second main surface of the semiconductor substrate.

10. The composite component according to claim 1, wherein, in addition to the elastic wave device and the semiconductor device, at least one of another elastic wave device and another semiconductor device is further stacked.

11. The composite component according to claim 1, further comprising:
   a heat insulation layer in contact with the first main surface of the piezoelectric substrate and the first main surface of the semiconductor substrate; wherein
   the heat insulation layer has lower heat conductivity than each of the semiconductor substrate and the piezoelectric substrate.

12. The composite component according to claim 1, wherein
   the elastic wave device further includes:
      a support layer disposed on one of the first main surface and the second main surface of the piezoelectric substrate on which the IDT electrode is disposed, the support layer surrounding the IDT electrode; and
      a cover that covers the support layer.

13. The composite component according to claim 1, wherein the piezoelectric substrate is a piezoelectric-material substrate.

14. The composite component according to claim 1, wherein the piezoelectric substrate includes a support substrate and a piezoelectric layer that is disposed on the support substrate.

15. The composite component according to claim 14, wherein the elastic wave device includes a high-acoustic-velocity-material layer that is directly or indirectly stacked on the piezoelectric layer and in which a bulk wave propagates at an acoustic velocity that is higher than an acoustic velocity of an elastic wave that propagates in the piezoelectric layer.

16. The composite component according to claim 15, wherein the support substrate is a high-acoustic-velocity substrate that includes the high-acoustic-velocity-material layer.

17. The composite component according to claim 15, wherein the support substrate includes a low-acoustic-velocity-material layer that is stacked on the high-acoustic-velocity-material layer and in which a bulk wave propagates at an acoustic velocity that is lower than the acoustic velocity of an elastic wave that propagates in the piezoelectric layer.

18. A mounting structure for a composite component, comprising:
   the composite component according to claim 1; and
   a mounting substrate; wherein
   the composite component is mounted on the mounting substrate from one of a side of the second main surface of the piezoelectric substrate and a side of the second main surface of the semiconductor substrate of the semiconductor device.

19. The mounting structure according to claim 18, wherein
   the side electrode includes a plurality of side electrodes; and
   the side electrodes are connected to a common ground potential.

20. The mounting structure according to claim 18, wherein
   a metal layer is disposed between the first main surface of the piezoelectric substrate and the first main surface of the semiconductor substrate; and
   the metal layer is electrically connected to the side electrode.

* * * * *